US008946846B2

(12) United States Patent
Alam et al.

(10) Patent No.: US 8,946,846 B2
(45) Date of Patent: Feb. 3, 2015

(54) THIN FILM PHOTOVOLTAIC PANELS AND REPAIR METHODS

(71) Applicant: Purdue Research Foundation, West Lafayette, IN (US)

(72) Inventors: Muhammad Ashraful Alam, West Lafayette, IN (US); Sourabh Dongaonkar, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 24 days.

(21) Appl. No.: 13/761,914

(22) Filed: Feb. 7, 2013

(65) Prior Publication Data

US 2014/0217535 A1 Aug. 7, 2014

(51) Int. Cl.
H01L 31/05 (2014.01)
H01L 31/18 (2006.01)
H01L 31/02 (2006.01)

(52) U.S. Cl.
CPC .............. *H01L 31/18* (2013.01); *H01L 31/02* (2013.01)
USPC ...... 257/446; 257/431; 257/E21.09; 136/244; 136/252; 136/249; 136/258

(58) Field of Classification Search
USPC ............ 257/431, 446, E21.09; 136/244, 252, 136/249, 258
See application file for complete search history.

(56) References Cited

U.S. PATENT DOCUMENTS

| 4,640,002 | A | 2/1987 | Phillips et al. |
|---|---|---|---|
| 8,231,431 | B2 | 7/2012 | Gajaria et al. |
| 8,318,240 | B2 | 11/2012 | Zapalac et al. |
| 8,574,944 | B2 * | 11/2013 | Giolando ........................ 438/57 |
| 2010/0147353 | A1 | 6/2010 | Kamath |
| 2012/0094422 | A1 | 4/2012 | Ghandour |

OTHER PUBLICATIONS

Lien, Shui-Yang et al., "Innovation and Fabrication of 5.5 Generation Image-Patterned Translucent Photovoltaic Module by Using Laser Scribing Technology," Progress in Photovoltaics: Research and Applications, Prog. Photovolt: Res. Appl. (2011), Published online in Wiley Online Library (wileyonlinelibrary.com). DOI: 10.1002/pip.1211 (5 pgs.)

Haas, Stefan et al., "Novel Series Connection Concept for Thin Film Solar Modules," Progress in Photovoltaics: Research and Applications, Prog. Photovolt: Res. Appl. (2012), Published online in Wiley Online Library (wileyonlinelibrary.com). DOI: 10.1002/pip.2128 (8 pgs.).

(Continued)

*Primary Examiner* — Michael Shingleton
(74) *Attorney, Agent, or Firm* — Lee & Hayes, PLLC; Christopher J. White

(57) ABSTRACT

Conductive layer(s) in a thin film photovoltaic (TFPV) panel are divided by first scribe curves into photovoltaic cells connected in series. At least one of the layers is scribed to isolate a shunt defect in a cell from parts of that cell away from the defect. The isolation scribes can substantially follow or parallel current-flow lines established by the design of the panel. A TFPV panel can be altered by, using a controller, automatically locating a shunt defect and scribing at least one of the conductive layers along two spaced-apart second scribe curves. Each second scribe curve can intersect the two first scribe curves that bound the cell with the defect. The two second scribe curves can be on opposite sides of the defect.

9 Claims, 11 Drawing Sheets

(56) References Cited

OTHER PUBLICATIONS

Ballesteros, J. J. et al., "Electrical Losses Induced by Laser Scribing During Monolithic Interconnection of Devices Based on a-Si:H," Science Direct, Physics Procedia 5 (2010) 293-300, available online at www.sciencedirect.com; 1875-3892 Copyright 2010 Published by Elsevier B.V. doi: 10.1016/j.phpro.2010.08.149 (8 pgs.).

Dongaonkar, Sourabh et al., "Universal Statistics of Parasitic Shunt Formation in Solar Cells, and Its Implications for Cell to Module Efficiency Gap+," Energy & Environmental Science, RSC Publishing, Copyright 2013 The Royal Society of Chemistry, DOI: 10.1039/c3ee24167j, www.rsc.org/ees (6 pgs.).

Dongaonkar, Sourabh et al., "End to End Modeling for Variability and Reliability Analysis of Thin Film Photovoltaics," 978-1-4577-1680-5/12/$26.00 Copyright 2012 IEEE, 4A.4.1 (6 pages).

\* cited by examiner

US 8,946,846 B2

THIN FILM PHOTOVOLTAIC PANELS AND REPAIR METHODS

FIELD OF THE INVENTION

The present application relates to photovoltaic panels, and particularly to such panels having photovoltaic elements ("cells") that may contain shunt defects.

BACKGROUND OF THE INVENTION

Photovoltaic cells generate an electric current (photocurrent) when exposed to light. Thin-film photovoltaic (TFPV or, herein, simply "PV") panels (also called "modules") include PV cells and are commonly used to produce electricity from solar or other illumination. An exemplary PV panel includes a stack of a substrate, a transparent electrode layer on the substrate, a p-i-n semiconductor diode layer, and an opaque (e.g., reflective) electrode layer. Since conventional PV photodiodes develop relatively low voltages under illumination, the layers are divided, e.g., by laser scribing. Rather than the single panel being a single, large-area photodiode (very high current; very low voltage), areas of the diode layer ("cells") are separated from each other and connected in series by the conductive layers to form multiple spatially-separated area photodiodes (medium to high current; high voltage). For example, dividing a panel into ten series-connected cells would reduce the current to approximately 10% but increase the voltage by 10×.

TFPV panels as manufactured can contain defects, e.g., of sizes from 10-100 μm. These defects can provide current paths between the two electrode layers. Although the defects themselves are small, since TFPV panels use conductive and semiconductive layers spread over areas of the panel, a small defect can be electrically connected to a much larger area of the panel than the defect itself. For example, a shunt defect that electrically connects layers 120 and 140 (FIG. 1) can sink current generated across an entire cell 105. This can modify the operating point (e.g., voltage) of other portions of the same cell away from the maximum power point, thereby lowering the output power produced by the cell. Moreover, for large enough shunts, the shunted portion of the cell can consume the power output of other portions of the cell. Therefore, even a few large shunts can have a significant impact on the overall module efficiency (and yield), and contribute significantly to the gap between cell and module efficiencies.

Various schemes have been described for module scribing. For example, "Novel series connection concept for thin film solar modules" by Haas et al. (*Prog. Photovolt: Res. Appl.*, 2012; DOI: 10.1002/pip.2188) describes pointwise contacts between series cells instead of linewise contacts, but this does not reduce the negative effects of a shunt on its particular cells.

U.S. Pat. No. 4,640,002 to Phillips et al. describes using a laser to scan a reverse-biased PV panel to locate shunt defects. The semiconductor layer is scanned before a permanent second electrode is formed over that layer. The defect is then eliminated by applying localized high current to cause it to burn open, or by irradiating the shunt with a laser to burn the shunt open. However, this requires precise detection of the shunt locations and precise application of radiation to open the shunts. Moreover, larger shunts than the laser spot must be opened by successive laser shots spread over the shunt, which can consume a great deal of time in manufacturing. Also, this scheme operates on the semiconductor before a top electrode is formed, so shunt defects formed or induced by the top-electrode deposition or formation process cannot be detected in this way.

U.S. Pat. No. 8,231,431 to Gajaria et al. describes locating shunts optically and opening them by applying reverse bias to cells including shunts. However, application of reverse bias can damage PV cells. U.S. Pat. No. 8,318,240 to Zapalac et al. describes passivating or mechanically removing solar-cell structures in the vicinity of a defect, but this reduces the area available to generate current.

Accordingly, there is a need for ways of reducing the negative effects of shunt defects (e.g., power loss and localized heating) without significantly reducing the area available to generate power. It is also desirable that this need be met without significantly increasing the time required to manufacture a TFPV panel, and without increasing the probability of damaging a PV cell while opening the shunt.

BRIEF DESCRIPTION OF THE INVENTION

Moreover, shunts in TFPV modules pose unique challenges because the position of shunt formation is random, and the shunted regions adversely affect the neighbors. Additionally, because of the important role of conductive layers (e.g., electrodes) in shunt formation, shunts generally cannot be detected until after all layers are deposited and the series connections between cells are made. Therefore, there is a further need for a technique for alleviation of shunt effects that can be performed after process steps in an inline monolithic manufacturing flow.

According to an aspect, there is provided a thin film photovoltaic (TFPV) panel, comprising two spaced-apart conductive layers, the layers divided along a plurality of first scribe curves to form one or more photovoltaic cells connected in series, each cell laterally adjacent to two of the first scribe curves, wherein:

a) the panel includes a first shunt defect located in a selected cell of the photovoltaic cells and including an electrical connection between the conductive layers; and b) at least one of the conductive layers is scribed along two spaced-apart second scribe curves, each second scribe curve intersecting the two first scribe curves laterally adjacent to the selected cell, and the two second scribe curves being on opposite sides of the located first shunt defect.

According to another aspect, there is provided a thin film photovoltaic (TFPV) panel comprising two spaced-apart conductive layers, the conductive layers divided along a plurality of first scribe curves to form a plurality of photovoltaic cells connected in series, so that a current flow map having a plurality of flow lines is defined, wherein at least one of the conductive layers is further divided along a plurality of second scribe curves, each of which substantially follows one of the flow lines.

According to another aspect, there is provided a method of altering a thin film photovoltaic (TFPV) panel, comprising:

a) receiving the TFPV panel having two spaced-apart conductive layers, the conductive layers divided along a plurality of first scribe curves to form one or more photovoltaic cells connected in series, each cell laterally adjacent to two of the first scribe curves;

b) using a controller, automatically locating a shunt defect on the TFPV panel, the shunt defect located in a selected cell of the photovoltaic cells and including an electrical connection between the conductive layers; and c) scribing at least one of the conductive layers along two spaced-apart second scribe curves;

d) wherein the scribing is performed so that each second scribe curve intersects the two first scribe curves laterally adjacent to the selected cell, and the two second scribe curves are on opposite sides of the located shunt defect.

According to another aspect, there is provided a method of altering a thin film photovoltaic (TFPV) panel, comprising:

a) receiving the TFPV panel having two spaced-apart conductive layers, the conductive layers divided along a plurality of first scribe curves to form one or more photovoltaic cells connected in series, each cell laterally adjacent to two of the first scribe curves;

b) scribing at least one of the conductive layers along a plurality of spaced-apart second scribe curves;

c) wherein the scribing is performed so that each second scribe curve intersects at least two of the first scribe curves.

Various embodiments advantageously reduce the effects of shunts on cells by dividing those cells into subcells. This limits the area over which power loss and localized heating occur without significantly reducing the area available to generate power. Various aspects provide these advantages with a small, fixed additional time at manufacturing, using readily-available equipment. Various aspects perform scribe operations that are already common in PV manufacturing, so the probability of damage to PV cells is substantially not increased compared to existing processes. Various aspects produce second scribe curves using the same type of scribing tools or machines, or the same machines themselves, used for creating first scribe curves. This permits isolating shunts without requiring extra equipment.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

The attached drawings are for purposes of illustration and are not necessarily to scale.

DETAILED DESCRIPTION OF THE INVENTION

Figure 1:
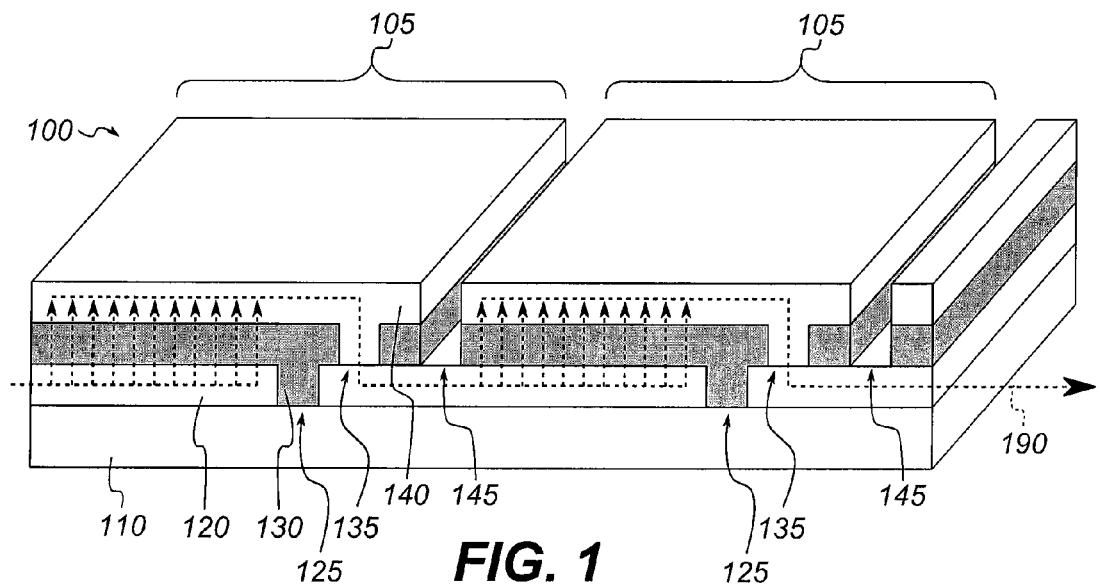
FIG. 1 is a perspective and cross-section of an exemplary thin-film photovoltaic (TFPV) panel.

FIG. 1 is a perspective and cross-section of exemplary thin-film photovoltaic (TFPV) panel 100 having PV cells 105 electrically connected in series. Conductive layers 120, 140 are spaced apart (except at contacts, as noted below) by photovoltaic layer 130, all of which are disposed over substrate 110. Layers 120, 130, 140 have been scribed (e.g., divided by cutting along a path) to form a series-connected structure in which current flows, e.g., as indicated by current path 190. Conductive layer 120 has been scribed along scribe lines 125, PV layer 130 has been scribed along scribe lines 135, and both PV layer 130 and conductive layer 140 have been scribed along scribe lines 145.

Scribing can be performed by laser-cutting, physical scribing (scratching), and plasma etching can also be used. Substrate 110 can be glass, plastic, or metal, and can be rigid or flexible. PV layer 130 includes one or more layer(s) or material(s) that together form a junction at which the photovoltaic effect is exhibited. In an example, PV layer 130 includes two layers forming a P-N junction, or three layers forming a p-i-n diode structure. Each conductive layer 120, 140 can be transparent or translucent, and one of the conductive layers 120, 140 can be opaque, e.g., reflective. Conductive layers 120, 140 can include metals or oxides, including transparent oxides, e.g., ITO (indium tin oxide). In various aspects, panel 100 is produced by successive deposition and scribing steps: deposit 120, scribe 125, deposit 130, scribe 135, deposit 140, scribe 145.

Scribe lines 125 isolate conductive layer 120 in each cell 105 from conductive layer 120 in adjacent cells. Similarly, scribe lines 145 isolate conductive layer 140 in each cell 105 from conductive layer 140 in adjacent cells. Scribe line 135 serves as a contact; at scribe line 135, conductive layer 140 of one cell 105 connects to conductive layer 120 of an adjacent cell 105.

For example, a laser conventionally referred to as "P1" can be fired through glass substrate 110 to form scribe line 125. A "P2" laser can be fired through glass 110 to form scribe line 135. A "P3" laser can be fired through glass 110 to form scribe line 145. Laser P3 provides electrical isolation of PV cells next to each other. A TFPV module (panel) can be from 1-2 m² in area, with ~100 cells in series, so that that each cell is approximately 1 cm by approximately 1 m in areal extent.

In general, conductive layers 120, 140 are divided along a plurality of first scribe curves to form one or more photovoltaic cells connected in series. Each cell is laterally adjacent to two of the first scribe curves, i.e., the scribe curves that separate it from its neighboring cells. The first scribe curves can be straight lines, connected line segments, curved segments, or any combination. As used herein, each of the first scribe curves corresponds to a particular layer of panel 100.

Figure 2:
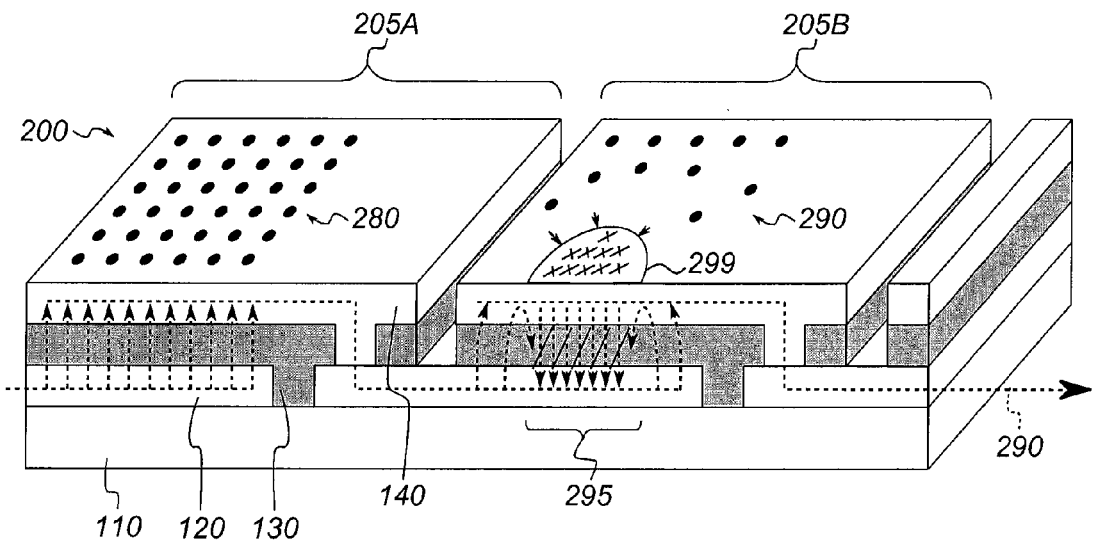
FIG. 2 is a perspective and cross-section of an exemplary thin-film photovoltaic (TFPV) panel with a shunt defect.

FIG. 2 is a perspective and cross-section of TFPV panel 200 having PV cells 205a and 205b connected in series. Layers 110, 120, 130, 140 are as shown in FIG. 1. Current flow is represented by the density of dots 280 shown in cell 205A. In cell 205A, current density is relatively uniform laterally. However, panel 200 includes shunt defect 299 located in one of the photovoltaic cells, here cell 205b. A defect that straddles a scribe line is defined herein to be "in" each of the cells on opposite sides of that scribe line. Shunt defect 299 includes an electrical connection between conductive layers 120, 140 (FIG. 1), represented graphically by diagonal lines in region 295. Therefore, some of the current driven from layer 120 to layer 140 by photovoltaic layer 130 flows through shunt defect 299 from layer 140 back to layer 120 instead of to the next cell in the PV panel. This reduces the net current flowing through PV layer 130 across cell 205B, represented graphically by the relatively wide spacing of dots 290 and by the vector-tail cross indicators in defect 299. As a result, the whole cell 205B runs at a lower voltage than cell 205A, and produces less power than cell 205A (assuming uniform illumination and equal size for cells 205A, 205B). Shunt defect 299 can be Ohmic, non-Ohmic, or diode-like.

Figure 3:
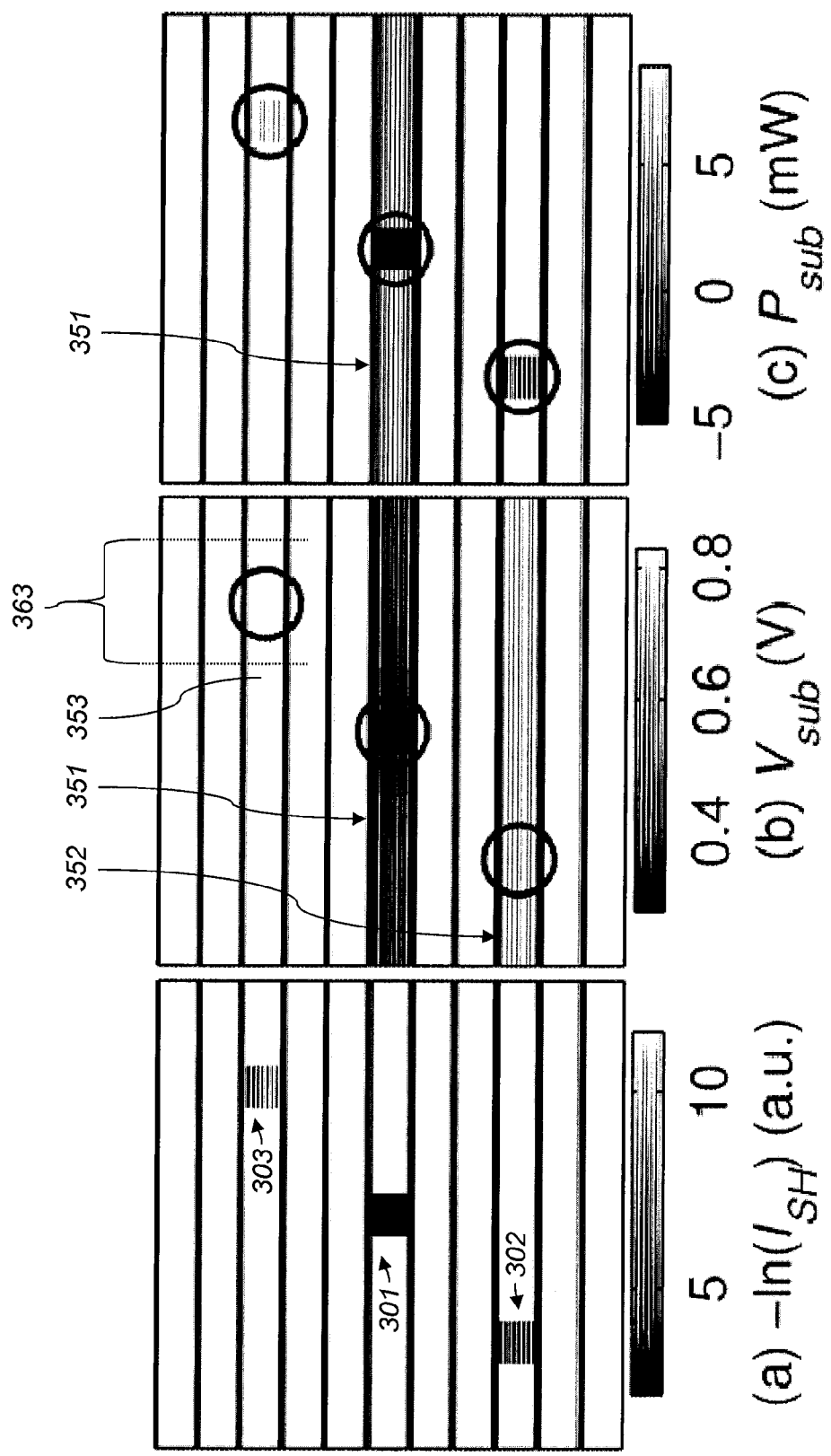
FIGS. 3A-3C show results of a simulation of the effects of shunts.

FIGS. 3A-3C show results of a simulation of the effects of shunts. The simulated panel is divided horizontally into 11 equal-sized cells, as shown as thin rectangles, in series from top to bottom. For the simulation, each cell is considered to include eleven sub-cells arranged in parallel. The simulation was performed using a 2-D SPICE circuit model of the subcells, using typical hydrogenated amorphous silicon (a-Si:H) technology, and assuming shunt current $I_{SH}$ is the only parameter that varies between sub-cells. Simulations were performed using SYNOPSYS HSPICE, but other circuit simulation software programs having corresponding capabilities can also be used to perform such simulations. The model includes, for each subcell, lumped representations of the photovoltaic element, inherent diode, shunt, and conductor sheet resistance. In this simulation, each subcell is 1 cm$^2$ in area. Throughout this disclosure, when the term "shunt" is used in the context of a simulation or the results of a simulation, "shunt" refers to a simulated shunted sub-cell.

FIG. 3A shows the locations of shunts. Shunt 301 is stronger (higher-conductance, lower-resistance) than shunt 302, which is stronger than shunt 303. The shunts are represented graphically as square subcells on the 11×11 subcell grid of the panel. Shunts on real panels can be on the order of 10-100 μm in diameter, but the relationship of a small shunt to the subcell that contains it is not simulated or represented here. This permits more clearly showing the effects of shunts across the panel.

FIG. 3B shows the voltage of each subcell. Cell 351 includes shunt 301, and the voltage of each subcell in cell 351 is significantly reduced by the fact that a significant amount of current flows through shunt 301 instead of through the photovoltaic layer in cell 351. Cell 352 includes shunt 302, and its voltage is reduced somewhat. Cell 353 includes shunt 303, and its voltage is not reduced very much. Also, the voltage is only significantly reduced over lateral extent 363 of cell 353. This is because conductive layers 120, 140 (FIG. 2) themselves have some positive sheet resistance. Shunt 303 is connected to the rest of cell 353 via those resistive conductors, so the effect of a weak shunt is localized.

FIG. 3C shows the power output of each subcell. As in FIG. 3B, the subcells of cell 351 experience significant power reduction, as do the subcells that include shunts 302, 303. The change in power due to shunts can depend on the change in voltage of the subcell with the shunt, the conductance of the shunt, and the conductivity of conductive layers 120, 140 (FIG. 1).

In various aspects, the TFPV panel is scribed along second scribe lines not parallel to the scribe lines between cells in order to reduce the loss of panel efficiency due to shunt defects. In some aspects, shunts are detected and scribes of a fixed length are used to isolate them. In some aspects, shunts are detected and scribes are used to isolate them, and the length of those scribes depends on the strength (e.g., conductivity) of the shunt. In some aspects, shunts are not detected, and the panel is simply scribed with a fixed number of scribes extending across the panel. Various examples of these are described below. In some aspects, shunts are not detected, and the panel is scribed with a fixed number of scribes extending part-way across the panel.

Figure 4:
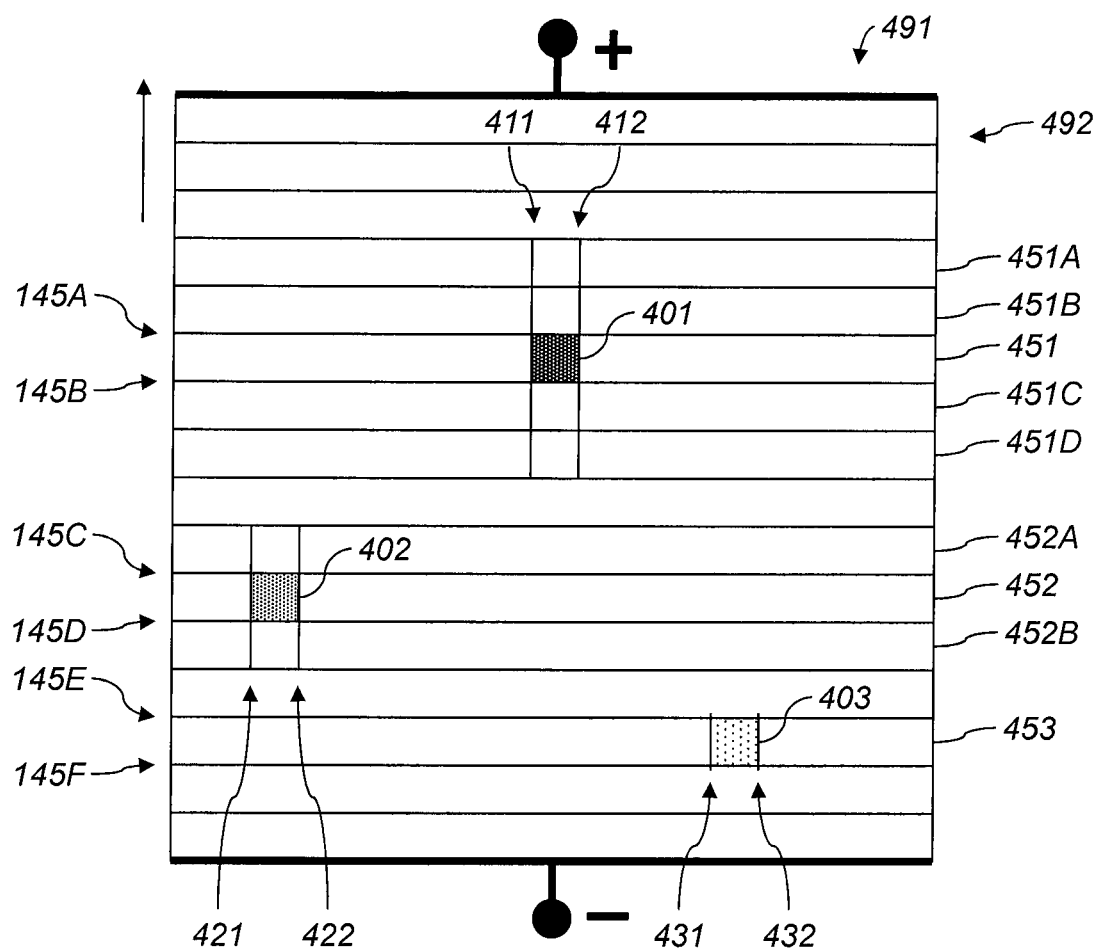
FIG. 4 is a top view of a TFPV panel having shunts, and additional scribe lines used to isolate those shunts according to various aspects.

FIG. 4 is a top view of a TFPV panel having shunts 401, 402, 403 (in that order strong to weak; strength is represented by darkness of hatching). Current flows from bottom to top, as indicated, to develop a positive voltage on the + electrode with respect to the − electrode. Scribe lines 145A-145F separate the cells; for clarity, not all scribe lines are labeled, nor are all cells. Scribe lines 145A-145F are referred to herein as first scribe lines.

In the example shown here, shunts are isolated from other subcells in the same cell by additional scribe lines. Specifically, at least one of the conductive layers (e.g., conductive layers 120, 140; FIG. 1) is scribed along two spaced-apart second scribe curves. In this example, cell 452 is scribed along second scribe curves 421, 422. Each second scribe curve 421, 422 intersects the two first scribe curves 145C, 145D that are laterally adjacent to cell 452 that includes shunt defect 402. The second scribe curves can intersect the first scribe curves at any angle, and any number of times. The two second scribe curves 421, 422 are on opposite (i.e., laterally-opposite) sides of the located shunt defect 402. Note that the second scribe curves can wrap around or otherwise be located on opposite sides of the shunt in some places and on the same side in other places. The second scribe curves can include any number of connected segments, each straight or curved. The second scribe curves do not have to be immediately adjacent to the shunt.

Continuing this example, shunt 403 in cell 453 is isolated by third scribe curves 431, 432. Specifically, second shunt defect 403 is located in second selected cell 453 of the photovoltaic cells and includes an electrical connection between the conductive layers. At least one of the conductive layers is scribed along two spaced-apart third scribe curves 431, 432, each third scribe curve intersecting the two first scribe curves 145E, 145F laterally adjacent to the second selected cell 452. The two third scribe curves 431, 432 are on opposite sides of the located shunt defect 403. The attributes of second scribe curves described herein also apply to third scribe curves, and vice versa.

In various aspects, since shunt defect 402 has a higher conductance (is stronger) than shunt defect 403, the shorter of the second scribe lines 421, 422 is longer than the longer of the third scribe lines 431, 432. The stronger shunt gets the longer second or third scribe lines. In other aspects, the second or third scribe lines are the same length regardless of the strength of the shunt. In various aspects, such as that shown here, at least one of the second scribe curves 421, 422 extends across at least part of more than one of the cells. In this example, scribe curves 421, 422 extend across cells 452, 452A, 452B.

Continuing this example, shunt 401 in cell 451 has on opposite sides of it scribe lines 411, 412 that intersect first scribe lines 145A, 145B. Scribe lines 411, 412 extend across cells 451A-451D.

In various aspects, the panel is substantially a parallelogram, e.g., a rectangle. First scribe curves 145A-145F extend substantially parallel to a first selected one of the sides of the parallelogram, here, side 491. The second scribe curves extend substantially parallel to a second selected one of the sides of the parallelogram (here, side 492) adjacent to the first selected one of the sides (side 491). In general, the second and third scribe curves extend parallel to the direction of current flow in the panel from cell to cell.

Figures 5A, 5B:
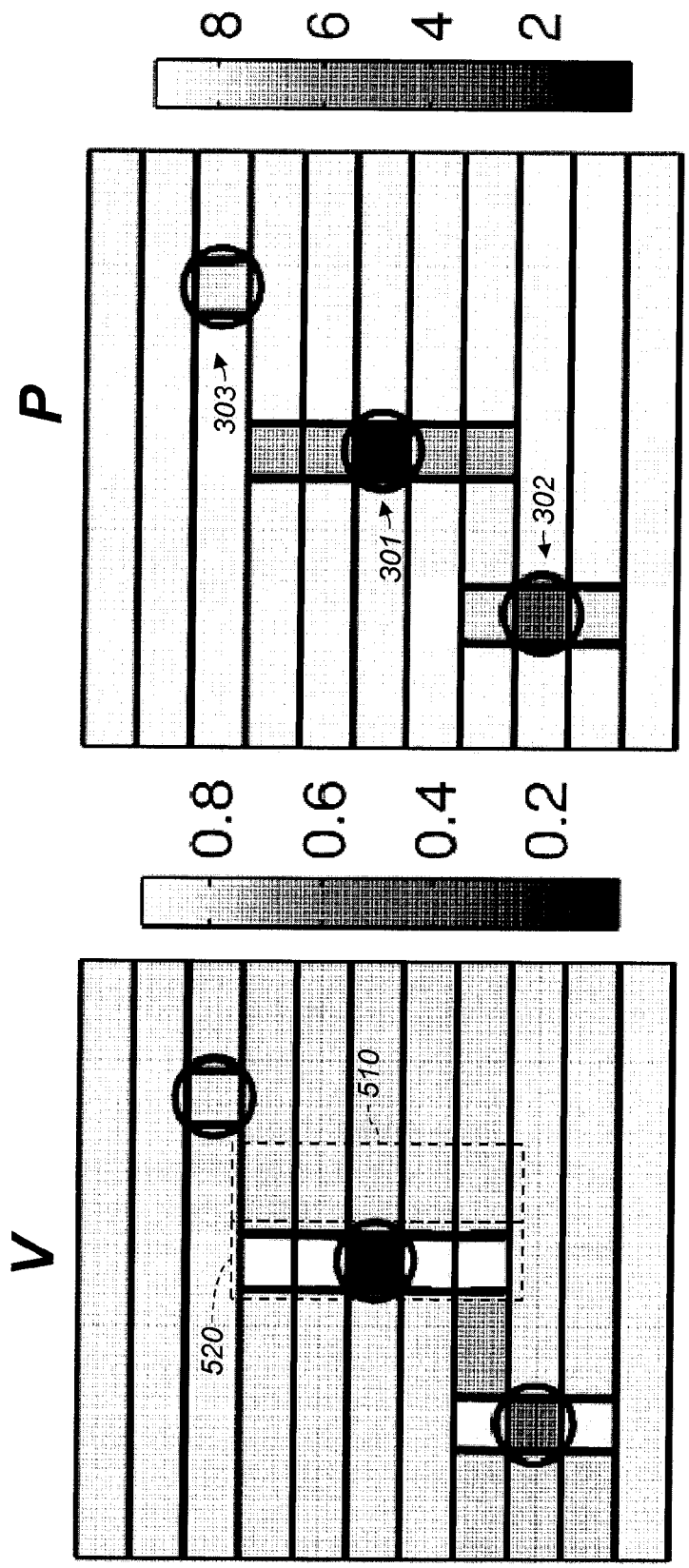
FIGS. 5A and 5B show simulated subcell voltage and subcell power, respectively, for a panel having such additional scribe lines.

FIGS. 5A and 5B show simulated subcell voltage and subcell power, respectively, for a panel of the configuration shown in FIGS. 3A-3C, but with second (and third) scribe curves on the panel. As FIG. 5B shows, the second and third scribe lines isolate a shunt in one subcell from the other subcells in that cell. If a second-scribe-line pair extends across multiple cells (e.g., for shunt 301), the other subcells in that pair suffer a reduction in power, but the reduction is not as significant as is the reduction of power in the entire cell in the comparative example of no second scribe lines (FIG. 3C).

FIG. 5A shows simulations of subcell voltages. Subcells with the shunts have lower voltages than subcells without shunts, since the shunt sinks some of the current flowing through the voltage-generating photovoltaic layer. When the second scribe curves extend across more than one cell, the subcells in series with the shunt increase in voltage. This because the sub-cells between the scribes are electrically in parallel with the sub-cells not between the scribes. For example, the four good subcells and the one shunted subcell in region 520 are electrically in parallel with the five good subcells in region 510. Since the voltage of the shunted subcell is near zero, each of the four good subcells in region 520 carries 5/4 the voltage of a subcell in region 510. In various PV panel and cell designs, that any change in voltage away from a selected operating point can be detrimental. Therefore, even though the voltages of the good subcells in region 520 increase, the power outputs of those cells drop, as shown in FIG. 5A.

Figures 6A, 6B:
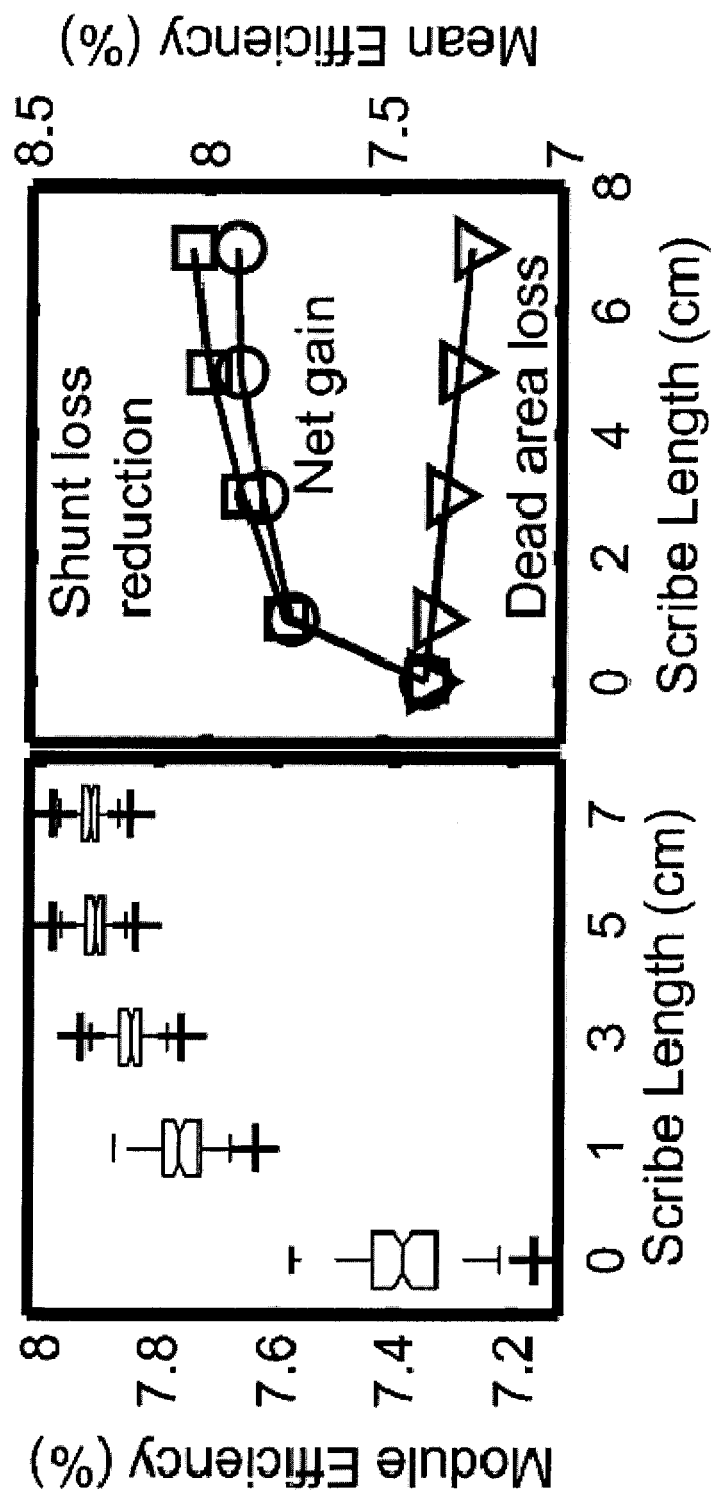
FIGS. 6A and 6B show simulation results of scribing to isolate shunt defects on a panel according to various aspects.

FIGS. 6A and 6B show simulation results of scribing to isolate shunt defects on a panel. Monte Carlo simulations of a 100×100 cm panel were performed under the assumptions that shunts are log-normally distributed, all shunts above a certain threshold are detected, and each detected shunt is isolated with second scribe curves of a particular length. That length is the abscissa in FIGS. 6A and 6B. Every detected shunt was simulated to be isolated with second scribe curves of the same length, regardless of the strength of the shunt. Further details of lognormal distribution are given in Dongaonkar et al., "Universal statistics of parasitic shunt formation in solar cells, and its implications for cell to module efficiency gap," *Energy Environ. Sci.* Jan. 9, 2013, DOI: 10.1039/c3ee24167j.

FIG. 6A is a box plot of the distribution of module efficiency. Increasing the length of scribe lines improves module efficiency, e.g., by reducing the amount of power lost to shunts. However, a second scribe line has a non-zero width, e.g., 50 μm. Therefore, every square millimeter of second scribe line on the panel is a square millimeter less photovoltaic material on the panel. FIG. 6B shows that as scribe length increases, this reduction in the material originally available to produce photocurrent decreases the efficiency of the panel slightly ("dead area loss"). The dead area loss offsets some of the gain in efficiency due to reduced shunt losses ("shunt loss reduction"). However, FIG. 6B clearly indicates that this technique can increase efficiency of TFPV panels ("Net gain" including both shunt loss reduction and dead area loss). In various aspects, the dead region within the second scribe line can be as thin as 50 μm compared to ~250 μm for typical series connections between cells such as some types of first scribe lines.

Figure 7:
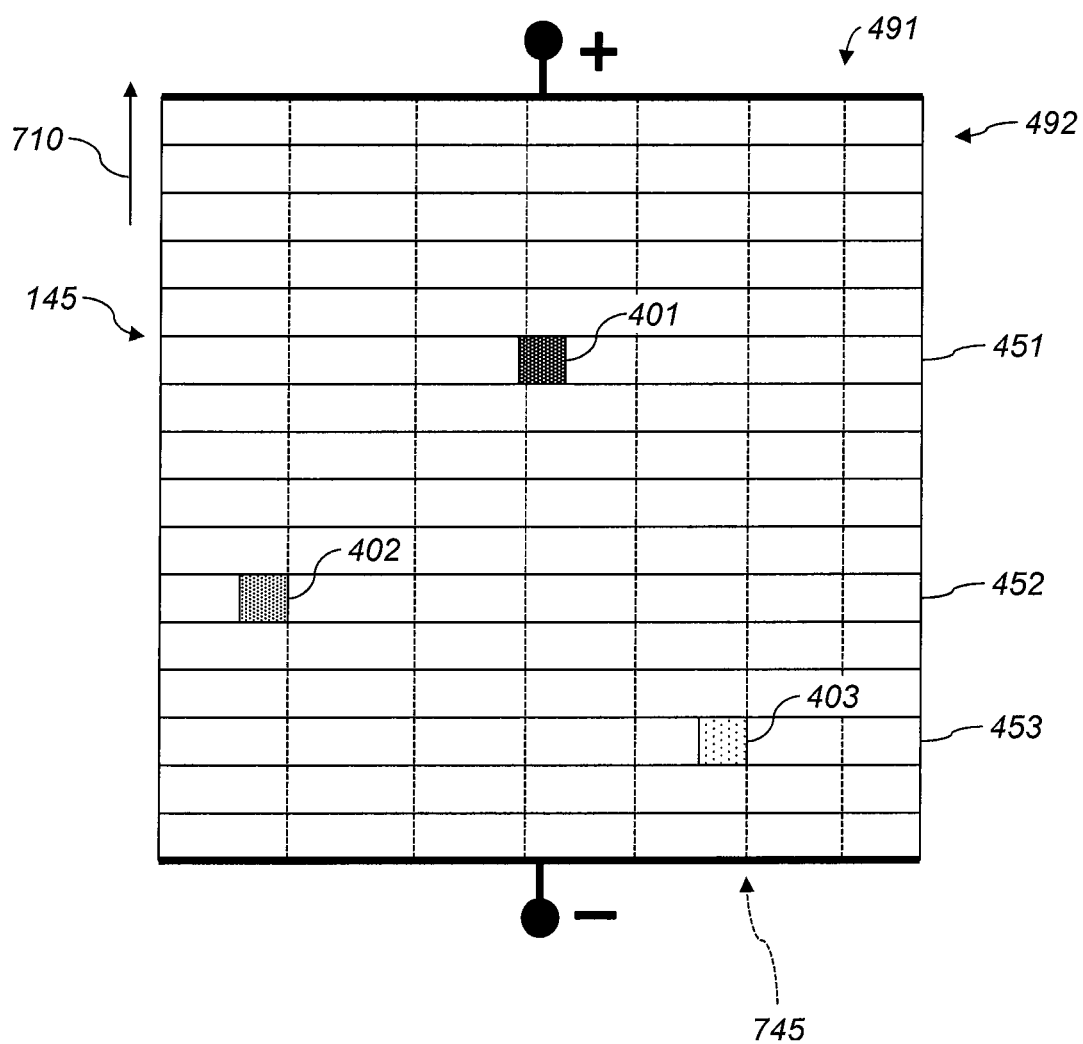
FIG. 7 is a top view of a TFPV panel having shunts, and additional scribe lines used to isolate those shunts according to various aspects.

FIG. 7 is a top view of a TFPV panel having shunts, and additional scribe lines used to isolate those shunts in other aspects. Second scribe curves are applied along the length of the panel in the direction of current flow, not necessarily immediately adjacent to shunt defects. Specifically, a TFPV panel has two spaced-apart conductive layers 120, 140 (FIG. 1) (or more). Layers 120, 140 are divided along a plurality of first scribe curves 145 to form a plurality of photovoltaic cells connected in series. Shunts 401, 402, 403, cells 451, 452, 453, sides 491, 492, and electrodes + and − are as shown in FIG. 4.

As a result of scribing along the first scribe curves, a current flow map is defined. The current flow map has a plurality of flow lines showing the direction of current flow at any point on the panel. The current flow map can be considered to be a 2-D vector field in the plane of the panel, or a 3-D vector field in the 3-D volume of the panel. In this example, the current flow map is a 2-D vector field everywhere parallel to arrow 710.

It is not necessary that the current flow map be calculated or that a closed-form solution exists for it. Instead, the current flow map is an inherent property of any TFPV panel that has been scribed this way. The current flow map is determined without reference to any shunt defects. The current flow map is determined by the geometry of the panel and of the first scribe curves, and by a selected typical sheet resistance of each layer. For a given panel configuration, the current flow map can be determined by measurement or simulation, or can be determined analytically by one skilled in the electromagnetic-field art.

At least one of the conductive layers is further divided along a plurality of second scribe curves 745, each of which substantially follows one of the flow lines. In this example, current flows straight from − to +, as in FIG. 4. As a result, the flow lines, and thus scribe curves 745, extend straight across the panel parallel to arrow 710. In this way, current from − to + is substantially unobstructed by second scribe curves 745. Scribe curves 745 are represented dashed here to visually differentiate them from scribe curves 145, but are continuous as etched into the panel. In this example, a scribe curve 745 passes through shunt defect 401. Various of these aspects advantageously permit reducing the deleterious effects of shunt defects without requiring a panel-inspection step to locate the shunts.

In various aspects, each of the first scribe curves 145 is a line segment, each of the second scribe curves 745 is a line segment, and the first scribe curves 145 are substantially orthogonal to the second scribe curves 145. In various of these aspects, the panel is substantially rectangular. The panel can also be a parallelogram, as described above.

Figure 8B:
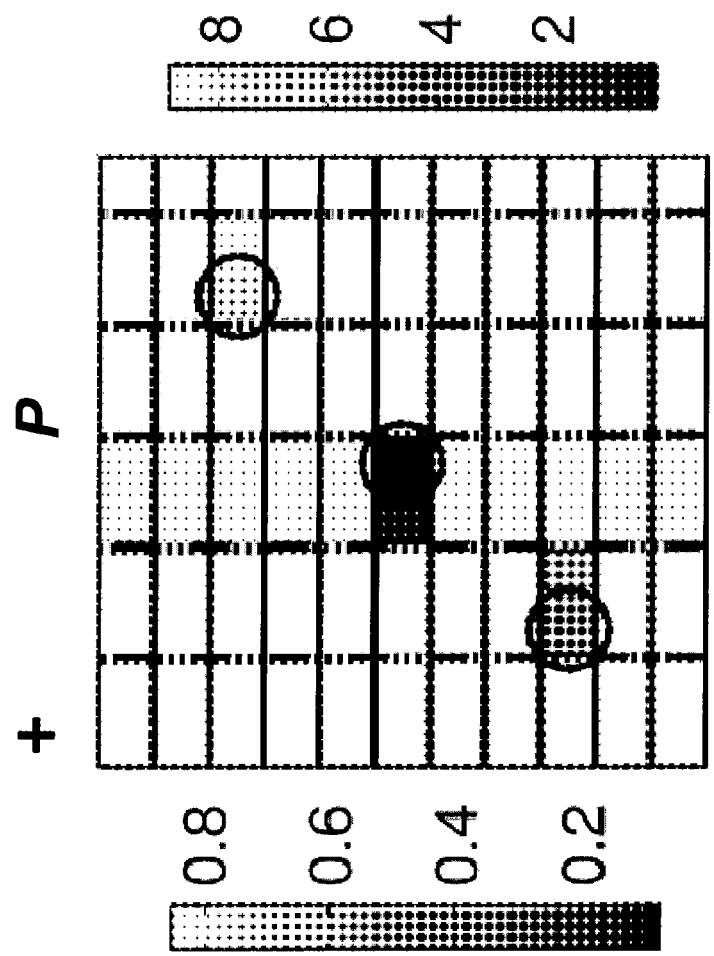
FIGS. 8A and 8B show simulated subcell voltage and subcell power, respectively, for a panel having such additional scribe lines.
Figure 8A:
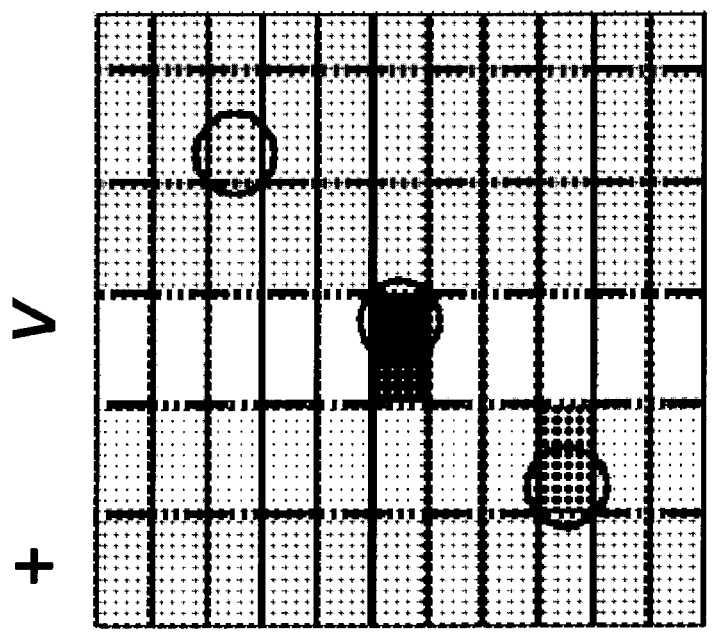

FIGS. 8A and 8B show simulations of voltage and power, respectively, of subcells of panels of the configuration shown in FIGS. 3A-3C, but with second scribe lines along the panel (graphically represented as dashed-stippled lines). In this example, the second scribe lines are five in number, and are spaced across the panel. As shown, the increase in voltage and reduction in power is confined between pairs of adjacent second scribe lines. This can provide higher efficiency than the panel without the second scribe curves.

In various aspects, a manufacturer knows that a certain region of a PV panel or module is more prone to shunting (e.g., an edge). Therefore, the panel is scribed along a fixed number of second scribe lines. However, instead of extending all the way across the PV panel as in FIGS. 8A-B, the second scribe lines only extend across a selected area, e.g., a selected distance in from the edge that is vulnerable to shunt formation.

Figures 9A, 9B:
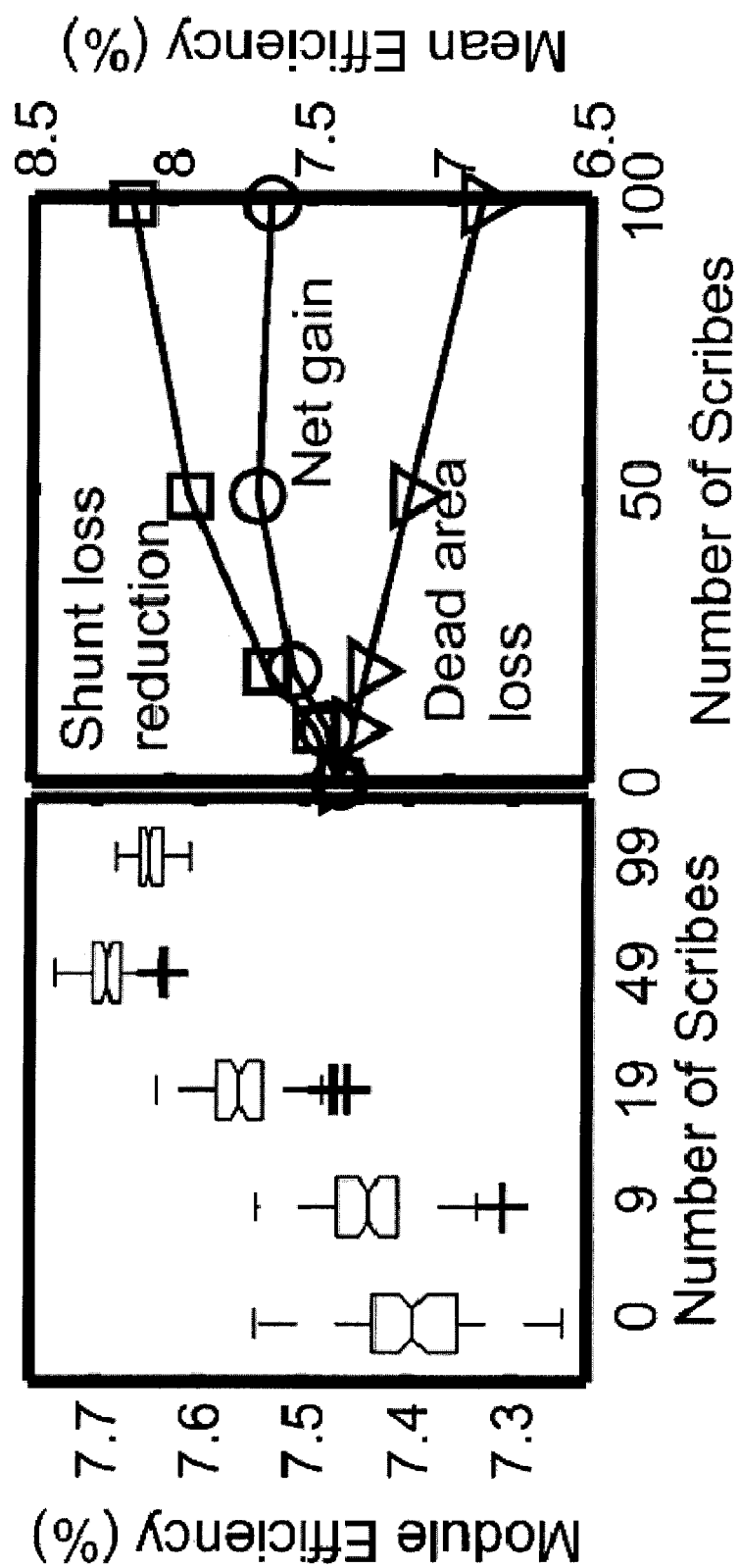
FIGS. 9A and 9B show simulation results of scribing to isolate shunt defects on a panel according to various aspects.

FIGS. 9A and 9B show simulation results of scribing to isolate random defects on a panel. Monte Carlo simulations of a 100×100 cm panel were performed under the assumptions that shunts are lognormally distributed. A selected number of second scribe lines are made on the simulated panel, spaced evenly across the width of the panel. The number of second scribe lines is the abscissa in FIGS. 9A and 9B. FIG. 9A is a box plot of the distribution of module efficiency, and FIG. 9B a plot of mean efficiency. Increasing the number of scribe lines improves module efficiency, e.g., by reducing the area of the panel that loses power into each shunt. As the number of second scribes increases, the amount of area occupied by second scribe lines instead of by photovoltaic material increases, offsetting some of the gain in efficiency due to reduced shunt losses. However, FIG. 9B clearly indicates that this technique can increase efficiency of TFPV panels. In various aspects, such simulations are performed for a particular TFPV panel configuration and the number of second scribe lines is selected to provide a local maximum of net gain (e.g., around 50 second scribe lines in this example).

Figure 10:
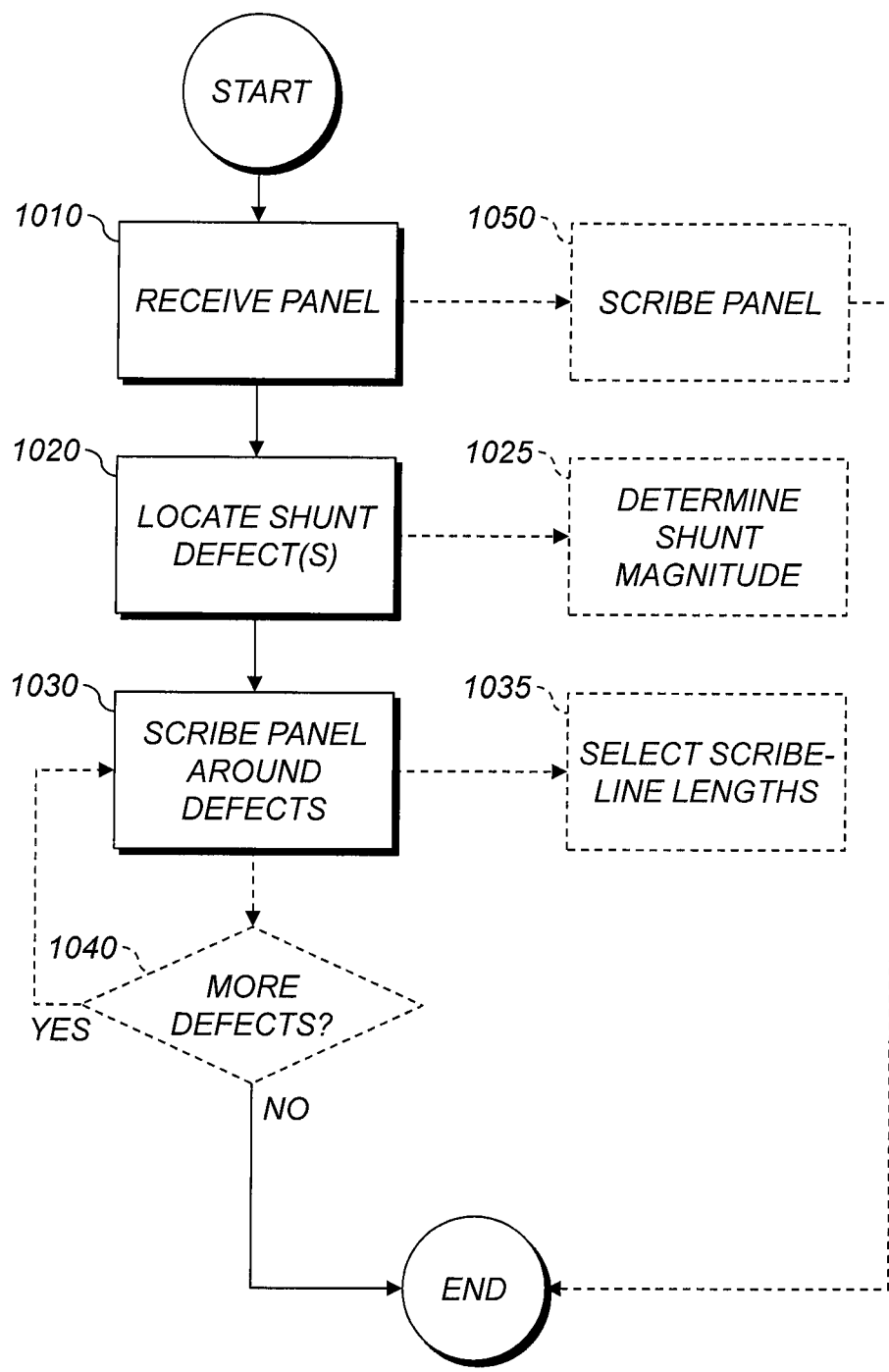
FIG. 10 shows a flowchart of methods of altering TFPV panels according to various aspects.

FIG. 10 shows a flowchart of methods of altering TFPV panels according to various aspects. The panels are altered by scribing second scribe curves on the panels to isolate shunt defects. Any of the arrangements of second (or third, and so forth) scribe lines described above can be used with various aspects. Various aspects can be used at manufacturing time after conductive layer 140 (FIG. 1) is deposited on the panel. Various aspects can be used to repair panels that have developed shunt defects in the field. Processing begins with step 1010.

In step 1010, the TFPV panel is received. The panel has two or more spaced-apart (except at the contacts, as described above) conductive layers. The conductive layers are divided along a plurality of first scribe curves (straight or bent, as described above) to form one or more photovoltaic cells connected in series. Each cell is laterally adjacent to two of the first scribe curves. Step 1010 is followed by step 1020.

In step 1020, using a controller, a shunt defect on the TFPV panel is automatically located. The shunt defect is located in (i.e., is determined to be in) a selected cell of the photovoltaic cells (if it straddles a scribe line, it is defined to be "in" each of the cells on opposite sides of the scribe line). The shunt defect includes an electrical connection between the conductive layers. Examples of shunt defects were discussed above, e.g., with reference to FIG. 2.

Shunt locations can be detected using electroluminescence (EL) or thermography techniques, e.g., dark lock-in thermography (DLIT). Electroluminescence images of PV panels show shunt defects or other damaged regions as dark spots. DLIT images of PV panels show shunt defects as bright spots. Examples of these techniques are given in A. Helbig, T. Kirchartz, R. Schaeffler, J. H. Werner, and U. Rau, "Quantitative electroluminescence analysis of resistive losses in Cu(In, Ga)Se2 thin-film modules," *Solar Energy Materials and Solar Cells*, vol. 94, no. 6, pp. 979-984, June 2010; and in O. Breitenstein and M. Langenkamp, *Lock-in thermography: basics and use for functional diagnostics of electronic components*. Springer, 2003, each of which is incorporated herein by reference. Step 1020 is followed by step 1030.

In an example of an electroluminescence technique, current is passed through the semiconductor junction (pn or pin), which then emits light (luminesces). Forward bias voltage is applied to a PV panel or module so that the current flows through the diode junction and creates luminescence. In shunt defect regions, however, the junction is destroyed. Defects therefore do not produce any light, thereby appearing as dark spots in the images.

In an example of a DLIT technique, reverse bias voltage is applied to solar cells or panels. Away from shunt defects, the diode is off and its current negligible. However, shunts conduct reverse current locally. This local current 'crowding' generates heat, which is captured using infra-red thermal cameras. Therefore, the shunts appear as bright spots in the infrared images.

In step 1030, at least one of the conductive layers is scribed along two spaced-apart second scribe curves. In various aspects, all of the conductive layers are scribed along the same set of second scribe curves. Scribing can be done using a laser or other scribing tools or techniques such as those described above. Scribing is performed under control of the controller or a scribing controller in communication with the controller.

The scribing is performed so that each second scribe curve intersects the two first scribe curves laterally adjacent to the selected cell (at any angle), and the two second scribe curves are on opposite sides of the located shunt defect, as described above. In this way, the second scribe curves isolate the shunt defect within a portion of a cell so that the defect cannot affect the voltage of the whole cell.

In various aspects, locating step 1020 includes step 1025, in which the controller automatically determines a magnitude of a detected shunt defect. For example, in an EL technique, the controller receives an image of the panel luminescing. Locating step 1020 includes finding dark spots in the image using conventional feature-finding techniques known in the image-processing art. In step 1025, the controller determines the minimum, mean, rms, or other characteristic of the pixel intensities of the located dark spots. The darker the spot, the stronger the defect. In an example of a DLIT technique, an image is again received, and in locating step 1020 bright spots are located in the image. In step 1025, the controller determines the maximum, mean, rms, or other characteristic of the pixel intensities of the located bright spots. The brighter the spot, the stronger the defect.

In various aspects using step 1025, step 1030 includes step 1035, in which the controller automatically selects respective lengths of the two second scribe curves based on the determined magnitude. The two scribe curves can be selected to be the same length as each other, or different lengths from each other. The controller can select the lengths by applying a selected formula to the determined magnitudes or by looking up the determined magnitudes in a provided table in a volatile or nonvolatile memory. The curves can be longer for stronger (lower-resistance) defects.

In various aspects, the respective lengths are selected so that each length is positively correlated with conductance of the shunt defect. The correlation can be, but does not have to be, strict proportionality. The appropriate correlation or mapping from shunt conductance to scribe length can be determined empirically by simulation or by physical cuts and measurements on panels. Scribe length for a panel having certain conductances of defects can be increased to find a length that mathematically optimizes panel efficiency. An example of such simulations is discussed above with reference to FIGS. 6A-6B.

In various aspects, locating step 1020 includes locating a plurality of shunt defects. After step 1030, in decision step 1040, the controller determines whether there are any detected shunts left to process. If so, step 1040 is followed by scribing step 1030, which is thus repeated for each of the located shunt defects. In various aspects, locating step 1020 is also repeated. For example, locating step 1020 can locate one defect at a time, and the method can terminate after step 1020 if no more defects are located.

In various aspects, all the second scribe curves for all of the located shunt defects are a selected length. For example, referring back to FIG. 4, the controller could have made scribe lines 411, 412, 421, 422, 431, 432 all the same length. In other aspects, steps 1025 and 1035 are used as described above for each repetition of locating step 1020 or scribing step 1030. In this way, the two corresponding second scribe curves have lengths selected based on the determined magnitude of the respective located shunt defect, e.g., positively correlated with conductance of the shunt defect.

In various aspects, the two second scribe curves are the same length. In various aspects, the scribing is performed so that at least one of the second scribe curves extends across more than one of the photovoltaic cells. An example of this is shown in FIG. 4 (scribe lines 411, 412, 421, 422), discussed above. In various aspects, each of the first plurality of scribe curves is a line segment, circular arc, or other plane curve or connected set of straight or curved segments.

In various aspects, step 1010 is followed by step 1050. In step 1050, at least one of the conductive layers is scribed along a plurality of spaced-apart second scribe curves. The scribing is performed so that each second scribe curve intersects at least two of the first scribe curves. For example, each first scribe curve and each second scribe curve can be a line segment, and the first and second scribe curves can be substantially orthogonal.

Figure 12:
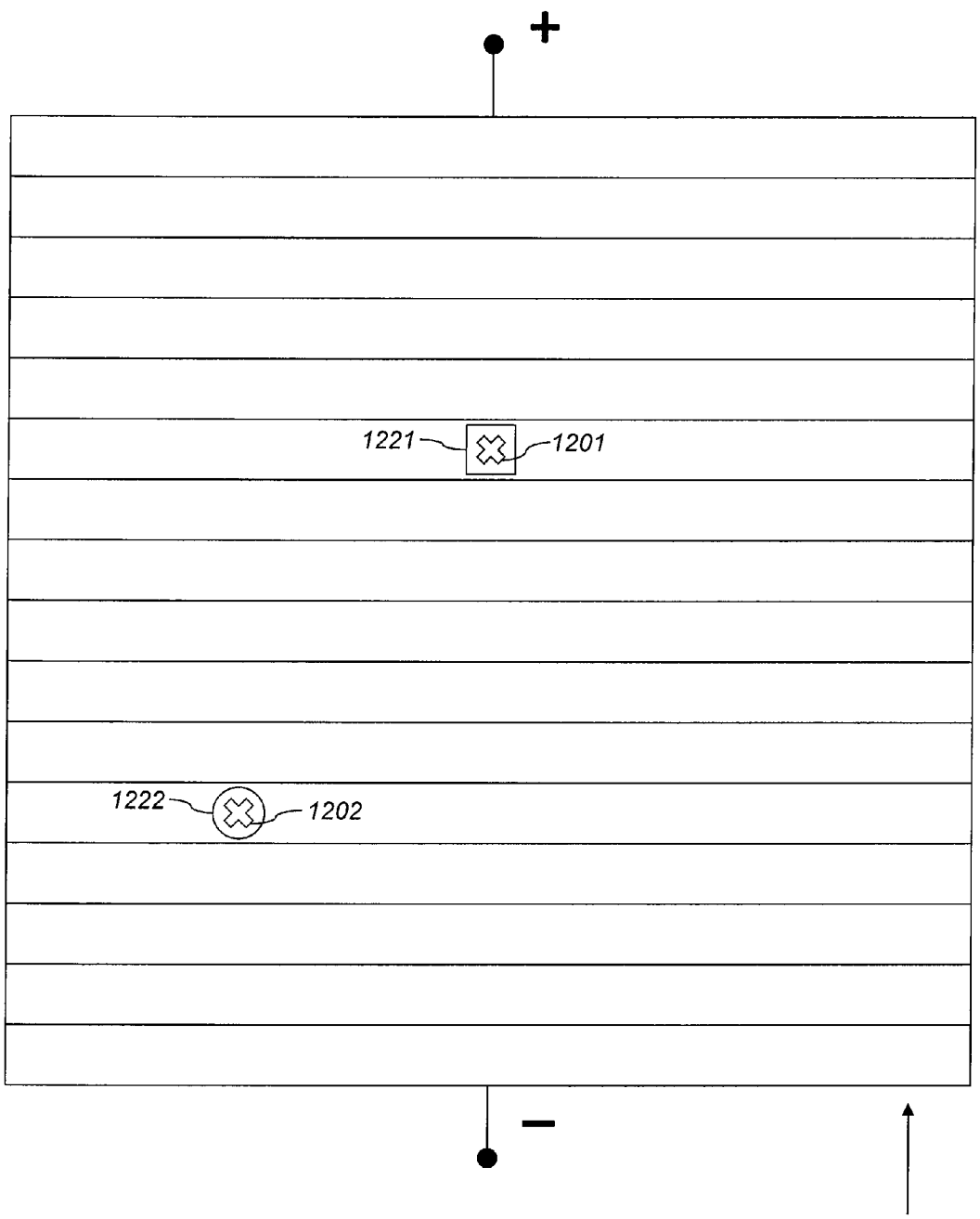
FIG. 12 is a top view of a TFPV panel having shunts, and additional scribe lines used to isolate those shunts according to various aspects.

FIG. 12 shows a top view of a TFPV panel similar to that shown in FIG. 7. The panel has shunts 1201, 1202. Around each shunt 1201, 1202 is scribed a respective closed scribe curve 1221, 1222. In general, once a defect is located (step 1020, FIG. 10), one or more of the conductive layer(s) is scribed in a closed scribe curve around the located shunt defect (step 1030, FIG. 10). The closed scribe curve can isolate the defect without unduly disrupting current flow. The area enclosed by the closed scribe curve, or the shape of the closed scribe curve, can be selected once for all shunts on a panel, or can be selected for each shunt (or for each group of shunts, e.g., with similar characteristics) based on the strength or shape of the shunt. In various aspects, a magnitude-determining step includes determining a strength or shape of the shunt from EL, DLIT, or other shunt data. A scribing step includes scribing the panel around that shunt in a closed scribe curve of the determined shape or size.

In view of the foregoing, various aspects automatically locate defects in PV cells and apply scribe lines to isolate them. A technical effect is to increase the power output and efficiency of a panel that has shunt defects, which can permit increasing manufacturing yield of TFPV panels.

Throughout this description, some aspects are described in terms that would ordinarily be implemented as software programs. Those skilled in the art will readily recognize that the equivalent of such software can also be constructed in hardware (hard-wired or programmable), firmware, or microcode. Accordingly, aspects of the present invention may take the form of an entirely hardware embodiment, an entirely software embodiment (including firmware, resident software, or micro-code), or an embodiment combining software and hardware aspects. Software, hardware, and combinations can all generally be referred to herein as a "service," "circuit," "circuitry," "module," or "system." Various aspects can be embodied as systems, methods, or computer program products. Because data manipulation algorithms and systems are well known, the present description is directed in particular to algorithms and systems forming part of, or cooperating more directly with, systems and methods described herein. Other aspects of such algorithms and systems, and hardware or software for producing and otherwise processing signals or data involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Figure 11:
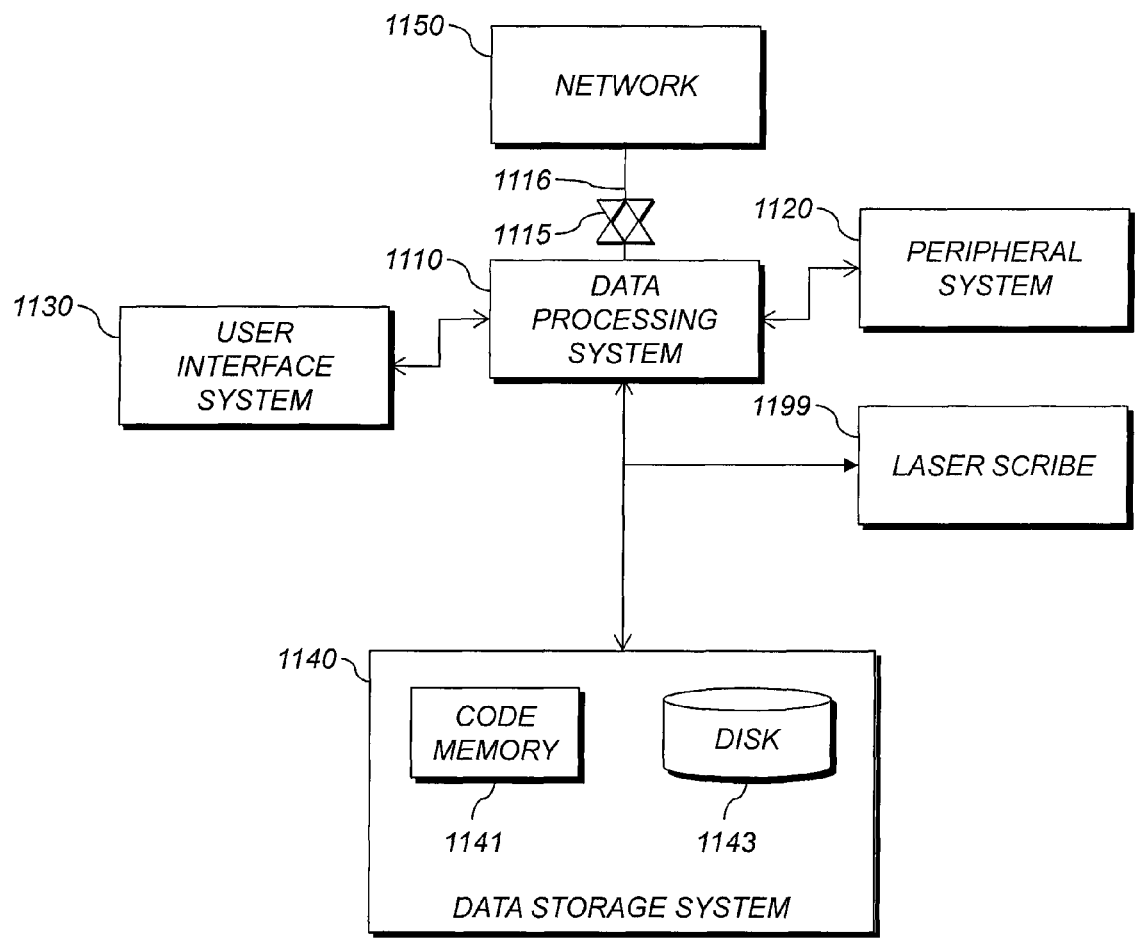
FIG. 11 is a high-level diagram showing components of a data-processing system.

FIG. 11 is a high-level diagram showing the components of an exemplary data-processing system for analyzing data and performing other analyses described herein. The system includes a data processing system 1110, a peripheral system 1120, a user interface system 1130, and a data storage system 1140. The peripheral system 1120, the user interface system 1130 and the data storage system 1140 are communicatively connected to the data processing system 1110. Data processing system 1110 can be communicatively connected to network 1150, e.g., the Internet or an X.25 network, as discussed below. In an example, the controller described above with reference to FIG. 10 can include one or more of systems 1110, 1120, 1130, 1140, and can connect to one or more network(s) 1150. The controller can include data processing system 1110 and connect to laser scribing system 1199 to alter TFPV panels as described above.

The data processing system 1110 includes one or more data processor(s) that implement processes of various aspects described herein. A "data processor" is a device for automatically operating on data and can include a central processing unit (CPU), a desktop computer, a laptop computer, a mainframe computer, a personal digital assistant, a digital camera, a cellular phone, a smartphone, or any other device for processing data, managing data, or handling data, whether implemented with electrical, magnetic, optical, biological components, or otherwise.

The phrase "communicatively connected" includes any type of connection, wired or wireless, between devices, data processors, or programs in which data can be communicated. Subsystems such as peripheral system 1120, user interface system 1130, and data storage system 1140 are shown separately from the data processing system 1110 but can be stored completely or partially within the data processing system 1110.

The data storage system 1140 includes or is communicatively connected with one or more tangible non-transitory computer-readable storage medium(s) configured to store information, including the information needed to execute processes according to various aspects. A "tangible non-transitory computer-readable storage medium" as used herein refers to any non-transitory device or article of manufacture that participates in storing instructions which may be provided to processor 304 for execution. Such a non-transitory medium can be non-volatile or volatile. Examples of non-volatile media include floppy disks, flexible disks, or other portable computer diskettes, hard disks, magnetic tape or other magnetic media, Compact Discs and compact-disc read-only memory (CD-ROM), DVDs, BLU-RAY disks, HD-DVD disks, other optical storage media, Flash memories, read-only memories (ROM), and erasable programmable read-only memories (EPROM or EEPROM). Examples of volatile media include dynamic memory, such as registers and random access memories (RAM). Storage media can store data electronically, magnetically, optically, chemically, mechanically, or otherwise, and can include electronic, magnetic, optical, electromagnetic, infrared, or semiconductor components.

Aspects of the present invention can take the form of a computer program product embodied in one or more tangible non-transitory computer readable medium(s) having computer readable program code embodied thereon. Such medium(s) can be manufactured as is conventional for such articles, e.g., by pressing a CD-ROM. The program embodied in the medium(s) includes computer program instructions that can direct data processing system 1110 to perform a particular series of operational steps when loaded, thereby implementing functions or acts specified herein.

In an example, data storage system 1140 includes code memory 1141, e.g., a random-access memory, and disk 1143, e.g., a tangible computer-readable rotational storage device such as a hard drive. Computer program instructions are read into code memory 1141 from disk 1143, or a wireless, wired, optical fiber, or other connection. Data processing system 1110 then executes one or more sequences of the computer program instructions loaded into code memory 1141, as a result performing process steps described herein. In this way, data processing system 1110 carries out a computer implemented process. For example, blocks of the flowchart illustrations or block diagrams herein, and combinations of those, can be implemented by computer program instructions. Code memory 1141 can also store data, or not: data processing system 1110 can include Harvard-architecture components, modified-Harvard-architecture components, or Von-Neumann-architecture components.

Computer program code can be written in any combination of one or more programming languages, e.g., JAVA, Smalltalk, C++, C, or an appropriate assembly language. Program code to carry out methods described herein can execute entirely on a single data processing system 1110 or on multiple communicatively-connected data processing systems 1110. For example, code can execute wholly or partly on a user's computer and wholly or partly on a remote computer or server. The server can be connected to the user's computer through network 1150.

The peripheral system 1120 can include one or more devices configured to provide digital content records to the data processing system 1110. For example, the peripheral system 1120 can include digital still cameras, digital video cameras, cellular phones, or other data processors. The data processing system 1110, upon receipt of digital content records from a device in the peripheral system 1120, can store such digital content records in the data storage system 1140.

The user interface system 1130 can include a mouse, a keyboard, another computer (connected, e.g., via a network or a null-modem cable), or any device or combination of devices from which data is input to the data processing system 1110. In this regard, although the peripheral system 1120 is shown separately from the user interface system 1130, the peripheral system 1120 can be included as part of the user interface system 1130.

The user interface system 1130 also can include a display device, a processor-accessible memory, or any device or combination of devices to which data is output by the data processing system 1110. In this regard, if the user interface system 1130 includes a processor-accessible memory, such memory can be part of the data storage system 1140 even though the user interface system 1130 and the data storage system 1140 are shown separately in FIG. 11.

In various aspects, data processing system 1110 includes communication interface 1115 that is coupled via network link 1116 to network 1150. For example, communication interface 1115 can be an integrated services digital network (ISDN) card or a modem to provide a data communication connection to a corresponding type of telephone line. As another example, communication interface 1115 can be a network card to provide a data communication connection to a compatible local-area network (LAN), e.g., an Ethernet LAN, or wide-area network (WAN). Wireless links, e.g., WiFi or GSM, can also be used. Communication interface 1115 sends and receives electrical, electromagnetic or optical signals that carry digital data streams representing various types of information across network link 1116 to network 1150. Network link 1116 can be connected to network 1150 via a switch, gateway, hub, router, or other networking device.

Network link 1116 can provide data communication through one or more networks to other data devices. For example, network link 1116 can provide a connection through a local network to a host computer or to data equipment operated by an Internet Service Provider (ISP).

Data processing system 1110 can send messages and receive data, including program code, through network 1150, network link 1116 and communication interface 1115. For example, a server can store requested code for, an application program (e.g., a JAVA applet) on a tangible non-volatile computer-readable storage medium to which it is connected. The server can retrieve the code from the medium and transmit it through the Internet, thence a local ISP, thence a local network, thence communication interface 1115. The received code can be executed by data processing system 1110 as it is received, or stored in data storage system 1140 for later execution.

The invention is inclusive of combinations of the aspects described herein. References to "a particular aspect" and the like refer to features that are present in at least one aspect of the invention. Separate references to "an aspect" or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

The invention claimed is:

1. A thin film photovoltaic (TFPV) panel, comprising two spaced-apart conductive layers, the layers divided along a plurality of first scribe curves to form one or more photovoltaic cells connected in series, each cell laterally adjacent to two of the first scribe curves, wherein:
    a) the panel includes a first shunt defect located in a selected cell of the photovoltaic cells and including an electrical connection between the conductive layers; and
    b) at least one of the conductive layers is scribed along two spaced-apart second scribe curves, each second scribe curve intersecting the two first scribe curves laterally adjacent to the selected cell, and the two second scribe curves being on opposite sides of the located first shunt defect.

2. The TFPV panel according to claim 1, further including a second shunt defect, located in a second selected cell of the photovoltaic cells and including an electrical connection between the conductive layers, wherein at least one of the conductive layers is scribed along two spaced-apart third scribe curves, each third scribe curve intersecting the two first scribe curves laterally adjacent to the second selected cell, and the two third scribe curves being on opposite sides of the located second shunt defect.

3. The TFPV panel according to claim 2, wherein the first shunt defect has a higher conductance than the second shunt defect, and wherein the shorter of the second scribe lines is longer than the longer of the third scribe lines.

4. The TFPV panel according to claim 1, wherein at least one of the second scribe curves extends across at least part of more than one of the cells.

5. The TFPV panel according to claim 1, wherein the panel is substantially a parallelogram, the first scribe curves extend substantially parallel to a first selected one of the sides of the parallelogram, and the second scribe curves extend substantially parallel to a second selected one of the sides of the parallelogram adjacent to the first selected one of the sides.

6. The TFPV panel according to claim 1, wherein each of the second scribe curves is a line segment.

7. A thin film photovoltaic (TFPV) panel comprising two spaced-apart conductive layers, the conductive layers divided along a plurality of first scribe curves to form a plurality of photovoltaic cells connected in series, so that a current flow map having a plurality of flow lines is defined, wherein at least one of the conductive layers is further divided along a plurality of second scribe curves, each of which substantially follows one of the flow lines.

8. The TFPV panel according to claim 7, wherein each of the first scribe curves is a line segment, each of the second scribe curves is a line segment, and the first scribe curves are substantially orthogonal to the second scribe curves.

9. The TFPV panel according to claim 8, wherein the panel is substantially rectangular.

* * * * *